United States Patent
Teranishi

(10) Patent No.: US 7,770,082 B2
(45) Date of Patent: Aug. 3, 2010

(54) SEMICONDUCTOR INTEGRATED CIRCUIT AND TEST METHOD THEREFOR

(75) Inventor: Kentaro Teranishi, Kanazawa (JP)

(73) Assignee: Toshiba Matsushita Display Technology Co., Ltd., Tokyo (JP)

( * ) Notice: Subject to any disclaimer, the term of this patent is extended or adjusted under 35 U.S.C. 154(b) by 579 days.

(21) Appl. No.: 11/797,527

(22) Filed: May 4, 2007

(65) Prior Publication Data

US 2007/0271488 A1 Nov. 22, 2007

(30) Foreign Application Priority Data

May 17, 2006 (JP) .............................. 2006-137753

(51) Int. Cl.
 *G01R 31/28* (2006.01)
 *G01R 31/26* (2006.01)
 *G11C 29/00* (2006.01)
(52) U.S. Cl. ....................... 714/724; 714/731; 365/201; 324/765
(58) Field of Classification Search ................. 714/724, 714/731; 324/765; 365/201
See application file for complete search history.

(56) References Cited

U.S. PATENT DOCUMENTS 7,280,620 B2 * 10/2007 Kajita ........................ 375/324

FOREIGN PATENT DOCUMENTS

| JP | 5-87890 | 4/1993 |
|---|---|---|
| JP | 10-65104 | 3/1998 |
| JP | 2003-139818 | 5/2003 |
| JP | 2006-107417 | 4/2006 |

* cited by examiner

*Primary Examiner*—Kevin L Ellis
*Assistant Examiner*—Guerrier Merant
(74) *Attorney, Agent, or Firm*—Finnegan, Henderson, Farabow, Garrett & Dunner, L.L.P.

(57) ABSTRACT

A first path for directly inputting a control signal from the outside to a data signal processor and a second path for inputting a control signal generated by a bus interface to the data signal processor can be selectively switched by a switching portion. At the test time of a timing controller, the first path is selected by the switching portion so that the control signal is directly input to the data signal processor without being passed through the bus interface having a slow operation clock, and thus the timing controller can be reliably tested. At the normal use time, the second path is selected by the switching portion, thereby the control signal is input via the bus interface to various kinds of processors such as the data signal processor, and thus the normal operation can be reliably treated.

4 Claims, 2 Drawing Sheets

SEMICONDUCTOR INTEGRATED CIRCUIT AND TEST METHOD THEREFOR

INCORPORATION BY REFERENCE

The present application claims priority under 35 U.S.C. §119 to Japanese Patent Application No. 2006-137753 filed on May 17, 2006. The content of the application is incorporated herein by reference in its entirety.

FIELD OF THE INVENTION

The present invention relates to a semiconductor integrated circuit having a control bus portion for processing an input signal from the outside to generate a control signal and output this control signal to a data signal processor, and a test method therefor.

BACKGROUND OF THE INVENTION

This type of semiconductor integrated circuit, that is, LSI used as a timing controller (T-COM), etc., for a liquid crystal panel, etc., which corresponds to a liquid crystal display device as a display device processes an input image signal to generate a digital image signal and a control signal, and outputs the generated image signal and control signal to a driver IC of the liquid crystal panel, etc.

Recently, timing controllers have performed various controls, and controls have gradually become complicated. Therefore, as disclosed in Japanese Laid-Open Patent Publication No. 2003-139818, a bus interface (hereinafter referred to as bus I/F) as a control bus portion for processing predetermined signals, for example, a serial clock, serial data from the outside is provided in the timing controller.

For LSI such as the timing controller, as described above, a test for detecting faults occurring in the LSI due to a manufacturing failure, etc., is carried out.

As a result, the test method described above has been used as a method using a tester for inputting a test pattern for testing an LSI and comparing an output expected value to the input with an actual output result to test a data signal processor.

However, the transfer rate of a bus I/F, that is, the bus clock is generally remarkably slower than the transfer rate of a data signal processor for processing image data, that is, the system clock. For example, the system clock is approximately several tens of MHz, however, the bus clock is approximately 100 kHz. Accordingly, even when a test pattern is input at a high speed, the test pattern is not input to the data signal processor at a high speed, and thus approximately four million clocks as the system clock are required to renew all the control registers.

On the other hand, the length of the test pattern output from the tester is restricted, and it is limited to approximately 100,000 clocks as the system clock at a maximum.

Accordingly, with respect to the above LSI, there is a problem that the data signal processor cannot be controlled on the basis of the test pattern and it is impossible to sufficiently test an LSI.

The present invention has been made in view of the above points, and an object thereof is to provide a semiconductor integrated circuit that can be reliably tested, and a test method for the semiconductor integrated circuit.

SUMMARY OF THE INVENTION

The present invention includes: a data signal processor for processing an input image signal on the basis of an input control signal; a control bus portion that has an operating clock slower than that of the data signal processor, processes an input signal from the outside to generate a control signal and can output the control signal to the data signal processor; a first path for directly inputting a control signal from the outside to the data signal processor; a second path for inputting the control signal generated by the control bus portion to the data signal processor; and a switching portion that can selectively switch the first path and the second path. The first path for directly inputting the control signal from the outside to the data signal processor and the second path for inputting the control signal generated by the control bus portion to the data signal processor can be selectively switched by the switching portion. Accordingly, the control signal from the outside can be directly input to the data signal processor without passing the control signal through the control bus portion having the slower operating clock by selecting the first path by the switching portion to reliably perform testing. In addition, the control signal can be input to the data signal processor through the control bus portion by selecting the second path by the switching portion, thereby the normal operation can also be performed.

DETAILED DESCRIPTION OF THE PREFERRED EMBODIMENT

The construction of a semiconductor integrated circuit according to an embodiment of the present invention will be described below with reference to FIG. 1 and FIG. 2.

Figure 2:
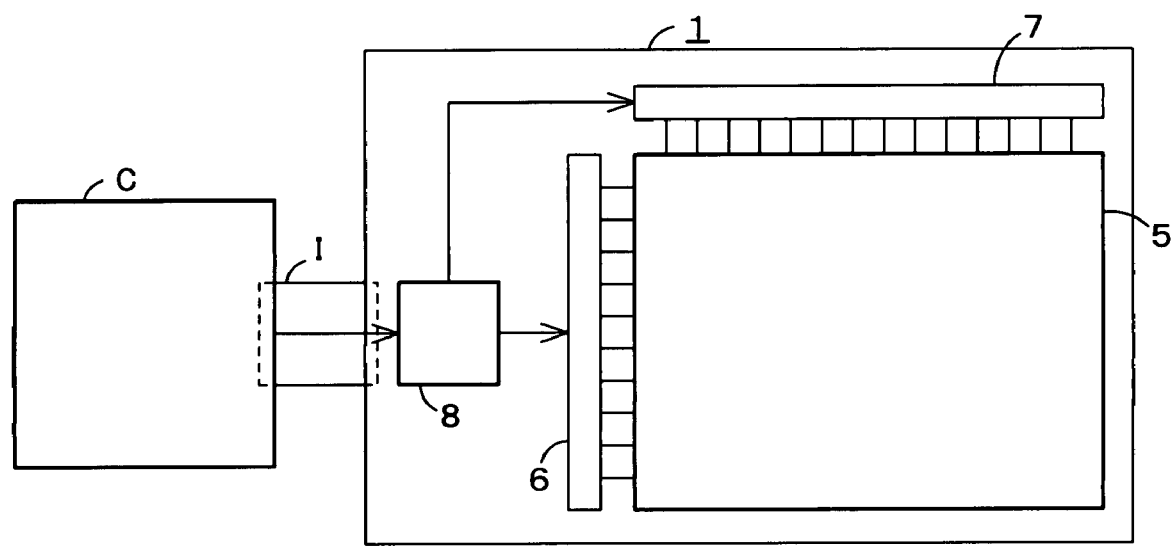
FIG. 2 is a block diagram showing a display system having the semiconductor integrated circuit.

In FIG. 2, 1 represents an LCD panel as a liquid crystal display device serving as a display device, and the LCD panel 1 is electrically connected to a computer C via an interface I.

The LCD panel 1 can perform liquid-crystal display, and serves as an image display device as a display unit using thin film transistors (TFT) as switching elements arranged in a matrix form. The LCD panel 1 is provided with a gate driver 6 and a source driver 7 as driver circuits along the side edge and end edge of a rectangular display area 5. The gate driver 6 and the source driver 7 are electrically connected to the gate electrodes and source electrodes of the thin film transistors respectively, so that the operation of each thin film transistor can be controlled. Furthermore, the LCD panel 1 is provided with a timing controller (T-CON) 8 such as an LSI as a semiconductor integrated circuit for switching the control timing of the gate driver 6 and the source driver 7 and processing image signals ($R_{data}$, $G_{data}$, $B_{data}$) input from a graphic chip of the computer C via the interface I and control signals and outputs the processed signals to the respective drivers 6 and 7.

On the basis of the image signals ($R_{data}$, $G_{data}$, $B_{data}$), the timing controller 8 outputs the control signals such as an operating clock for horizontal scanning and a horizontal synchronous start pulse to the source driver 7, and also outputs an operating clock for vertical scanning and a vertical synchronous start pulse to the gate driver 6.

Figure 1:
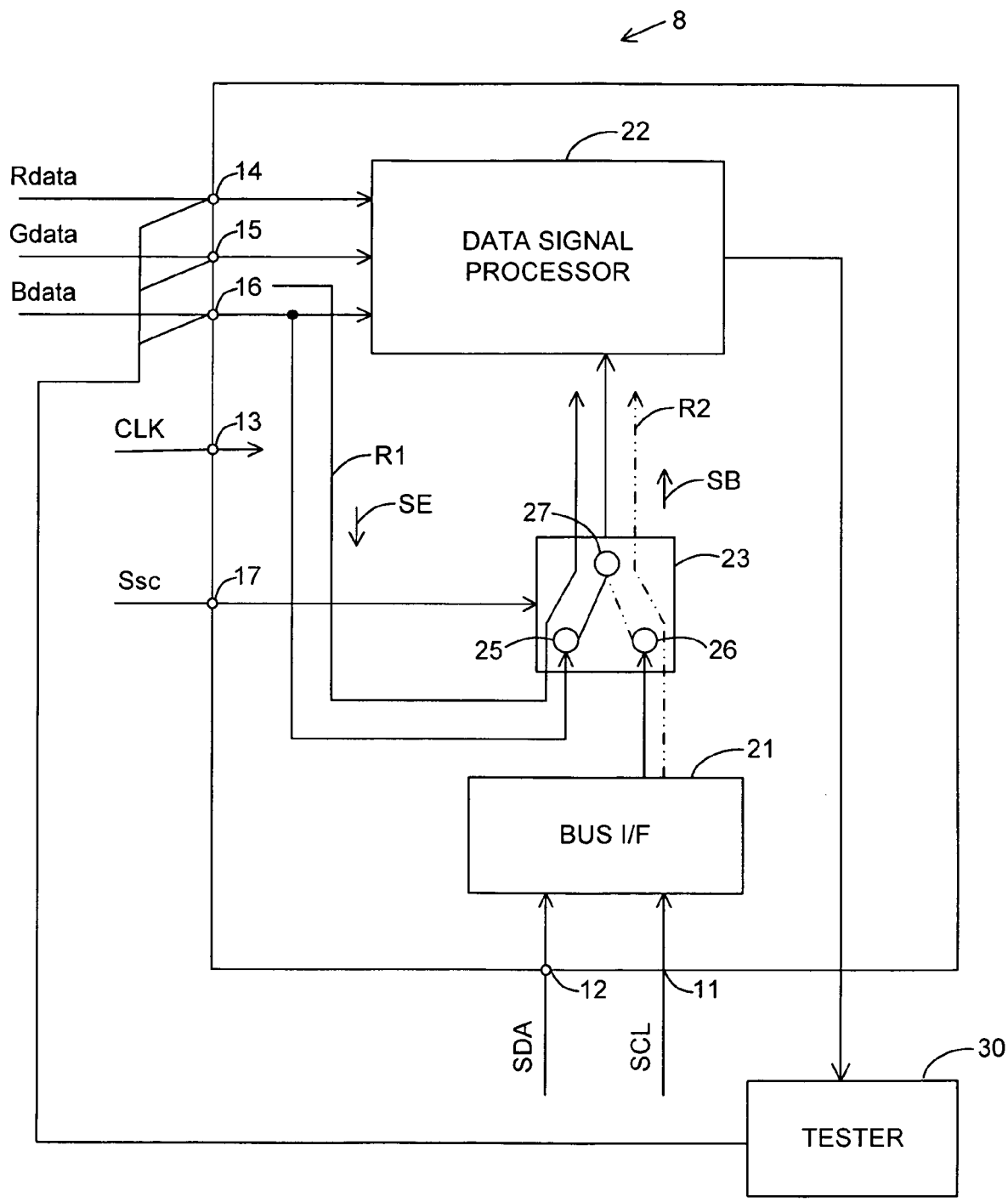
FIG. 1 is a block diagram showing a semiconductor integrated circuit according to an embodiment of the present invention.

As shown in FIG. 1, the timing controller 8 is equipped with various input terminals such as serial input terminals 11, 12 to which a serial clock signal (SCL) and a serial data signal (SDA) transmitted from the computer C side are input, a clock input terminal 13 to which a system clock signal (CLK) transmitted from the computer C side is input, signal input terminals 14, 15, 16 corresponding to data input pins as input terminals to which the image signals ($R_{data}$, $G_{data}$, $B_{data}$) transmitted from the computer C side are input, a switching input terminal 17 for a switching control signal, and output terminals (not shown) for outputting various kinds of processed signals to the outside. Furthermore, the timing controller 8 is provided with various kinds of processors such as a bus interface (bus I/F) 21 corresponding to a control bus signal processor as a control bus portion for generating the control signals on the basis of the serial clock signal (SCL) and the serial data signal (SDA), a data signal processor 22 for generating a digital image signal in accordance with a control signal written by the bus interface 21 on the basis of the system clock signal (CLK) and the image signal ($R_{data}$, $G_{data}$, $B_{data}$) transmitted from the computer C side, and a switching portion 23 for switching the input path for the control signal.

The bus interface 21 is a so-called I2C bus. The serial clock signal (SCL) and the serial data signal (SDA) are input to the bus interface 21 via the serial input terminals 11 and 12, and a control signal SB is generated on the basis of these signals and input to control registers (not shown) of various kinds of processors such as the data signal processor 22. The bus interface 21 has an operation clock which is slower than the operation clock of the data signal processor 22.

The operation of the data signal processor 22 is controlled on the basis of a control signal SE input from the outside or the control signal SB from the bus interface 21. The data signal processor 22 generates a digital image signal and a driver control signal on the basis of the system clock signal (CLK) and the image signals ($R_{data}$, $G_{data}$, $B_{data}$) input via the respective input terminals 13, 14, 15, 16, and outputs these signals to the respective drivers 6, 7.

The switching portion 23 is a switch having a pair of input terminals 25, 26 and one output terminal 27. The input terminal 25 is electrically connected to at least one of the signal input terminals 14, 15, 16, in this embodiment, the signal input terminal 16, the input terminal 26 is electrically connected to the output side of the bus interface 21, and the output terminal 27 is electrically connected to the input side of the data signal processor 22. Furthermore, the switching portion 23 is controlled to selectively electrically connect any one of the input terminals 25, 26 to the output terminal 27 on the basis of a switching control signal ($S_{sc}$) input from the outside as the computer C side via the switching input terminal 17.

As a result, the data signal processor 22 is provided with a first path R1 to which the control signal SE is input from the outside of the timing controller 8 via the signal input terminal 16, the input terminal 25 and the output terminal 27, and a second path R2 to which the control signal SB from the bus interface 21 is input via the input terminal 26 and the output terminal 27, and the paths R1 and R2 can be selectively switched by the switching portion 23.

Next, the operation of the above embodiment will be described.

As the test method of the timing controller 8, the switching portion 23 selects the first path R1 on the basis of the switching signal from the computer C side, the control signal SE input from the outside of the timing controller 8 is directly input to the data signal processor 22 via the signal input terminal 16 without being passed through the bus interface 21, and the operation of the data signal processor 22 is controlled on the basis of the control signal SE to process a test pattern input from a tester 30, and a predetermined signal is generated and output to the tester 30.

At this time, an output expected value in the timing controller 8 to the input test pattern is compared with an actual output result, thereby a defect, etc., in the timing controller 8 can be reliably checked.

On the other hand, when the normal operation is carried out, the switching portion 23 selects the second path R2 on the basis of the switching signal ($S_{SC}$) from the computer C side, and various kinds of signals generated by the computer C are input to the timing controller 8, and the control signal SB generated by the bus interface 21 is input via the second path R2 to the data signal processor 22. The data signal processor 22 the operation of which is controlled on the basis of the control signal SB generates the digital image signal and the driver control signal on the basis of the input clock signal (CLK) and the image signals ($R_{data}$, $G_{data}$, $B_{data}$) and outputs these signals to the respective drivers 6 and 7.

Then, the drivers 6 and 7 are controlled in operation on the basis of the control signals output from the timing controller 8, and write the digital image signal output from the timing controller 8 into predetermined thin film transistors, thereby desired pixels are turned on.

As described above, in the above embodiment, the first path R1 for directly inputting the control signal SE from the outside to the data signal processor 22, and the second path R2 for inputting the control signal SB generated by the bus interface 21 to the data signal processor 22 can be selectively switched by the switching portion 23.

Therefore, when the timing controller 8 is tested, the first path R1 is selected by the switching portion 23, thereby the control signal SE is directly input to the data signal processor 22 without being passed through the bus interface 21 whose operation clock is slow. Therefore, even when the length of the test pattern of the tester is restricted, the control register of the timing controller 8 can be reliably renewed and the timing controller 8 can be reliably controlled, so that the timing controller 8 can be reliably checked on the basis of the output from the timing controller 8.

At the normal-use time, the second path R2 is selected by the switching portion 23 so that the control signal SB is input via the bus interface 21 to the various kinds of processors such as the data signal processor 22, and thus a normal complicated operation can be reliably treated.

Furthermore, the signal input terminal 16 to which the image signal ($B_{data}$) is commonly used to directly input the control signal SE to the data signal processor 22, thereby the number of terminals of the timing controller 8 can be prevented from being increased.

In the above embodiment, an arbitrary LSI other than the timing controller 8, which has a control bus portion having a slow operation clock, can be used as the semiconductor integrated circuit. In this case, it is obvious that the present invention may be applied to not only the display device, but also various other devices.

What is claimed is:

1. A semiconductor integrated circuit comprising:
    a data signal processor for processing an input image signal on the basis of an input control signal;
    a control bus portion that has an operating clock slower than that of the data signal processor, for processing an input signal from outside of the circuit to generate a control signal and for outputting the generated control signal to the data signal processor;
    a first path for inputting a predetermined control signal from outside of the circuit to the data signal processor without passing the predetermined control signal through the control bus portion;

a second path for inputting the generated control signal to the data signal processor;

a switching portion for selectively switching the first path and the second path; and an input terminal electrically connected to the data signal processor, for inputting at least a part of the input image signal to the data signal processor, and for inputting the predetermined control signal when the first path is selected by the switching portion.

2. The semiconductor integrated circuit according to claim 1, wherein the semiconductor integrated circuit is a timing controller.

3. A method of supplying a signal for testing a semiconductor integrated circuit comprising a data signal processor for processing an input image signal on the basis of an input control signal; and a control bus portion that has an operating clock slower than that of the data signal processor, the control bus portion processing an input signal from outside of the circuit to generate a control signal and outputting the generated control signal to the data signal processor, the method comprising:

providing an input terminal for inputting at least a part of the input image signal to the data signal processor; and inputting, via the input terminal, a predetermined control signal from outside of the circuit to the data signal processor without passing the predetermined control signal through the control bus portion.

4. The method according to claim 3, wherein the semiconductor integrated circuit is a timing controller.

* * * * *